TRANSISTOR MULTIVIBRATOR CIRCUIT

Filed March 28, 1950 2 Sheets-Sheet 1

Inventor:
Richard F. Shea,
by Merlou D Moore
His Attorney.

Sept. 25, 1951 R. F. SHEA 2,569,345

TRANSISTOR MULTIVIBRATOR CIRCUIT

Filed March 28, 1950 2 Sheets-Sheet 2

Inventor:
Richard F. Shea,
by Merton D. Moore
His Attorney.

Patented Sept. 25, 1951 2,569,345

UNITED STATES PATENT OFFICE

2,569,345

TRANSISTOR MULTIVIBRATOR CIRCUIT

Richard F. Shea, Syracuse, N. Y., assignor to General Electric Company, a corporation of New York Application March 28, 1950, Serial No. 152,337

3 Claims. (Cl. 171—97)

Figure 1:
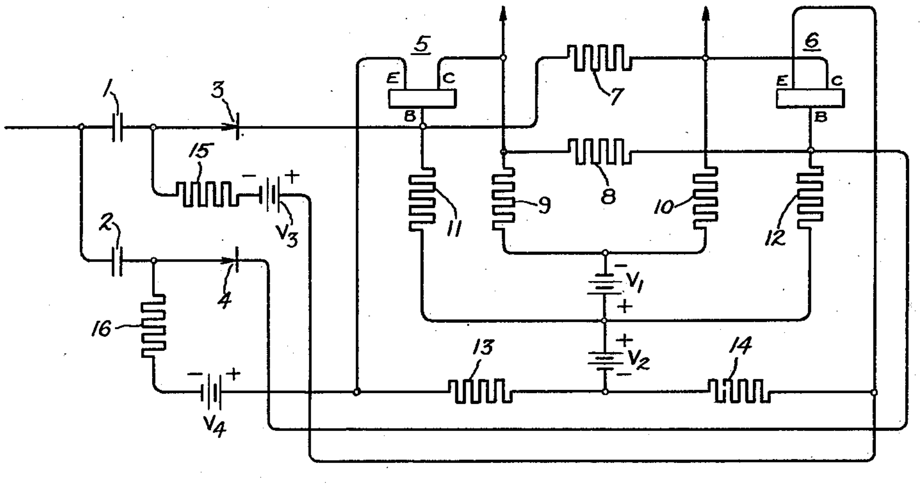

My invention relates to multivibrator circuits and, more particularly, to triggered multivibrator circuits including a pair of three electrode semi-conductor devices which are presently known in the art as transistors.

In the field of electronics, and more specifically radio, various types of electrical circuits are employed which, up to the present time, have necessarily included vacuum tubes. Because vacuum tubes are inherently bulky and fragile, they often require an excessive amount of space in any equipment in which they are employed, and this equipment usually must be handled with extreme caution. If radio circuits can be developed which do not include such fragile devices, they may find widespread application. A device which may be used to replace the vacuum tube in many radio circuits is the transistor, a three electrode semi-conductor, which includes a block of semi-conducting material such, for example, as silicon or germanium and which is provided on one of its surfaces with two closely adjacent point electrodes, which are called "emitter" and "collector" electrodes, and with a third electrode, which is called the "base" electrode, providing a large-area low resistance contact with another surface of the semi-conductor. Current flowing into the emitter and through the base electrode, which is the common electrode, may be used to control the current flowing in the collector electrode. Because a very small emitter current may control a very large collector current, this device finds application in amplifying circuits. A flip-flop multivibrator, which is a triggered multivibrator circuit (having two stable conditions), is one type of radio circuit in which omission of vacuum tubes is a great advantage. Therefore, it is an object of my invention to provide for a multivibrator circuit which employs three-electrode semi-conductor devices.

It is a further object of my invention to provide for a multivibrator which has two stable conditions and, furthermore, that application of a trigger pulse cause reversion from one stable condition to the other.

In the attainment of the foregoing objects, an important feature of this invention resides in the provision of a pair of transistors so arranged in an electronic circuit that current in one transistor automatically affects current in the other transistor. When a positive trigger pulse is applied to an input terminal, whichever transistor is in the low-conducting state begins to conduct more heavily and the other transistor which had been in the high-conducting state conducts less heavily. This condition continues until another positive trigger pulse is applied at the input terminal, at which time the first transistor again conducts less heavily. The output of this circuit is, therefore, a series of square-topped positive or negative pulses synchronized with the positive input signals.

For additional objects and advantages, and for a better understanding of my invention, attention is now directed to the following description and accompanying drawing, and also to the appended claims in which the features of the invention believed to be novel are particularly pointed out in which:

Fig. 1 is a schematic electric circuit diagram of a triggered multivibrator.

Figure 2:
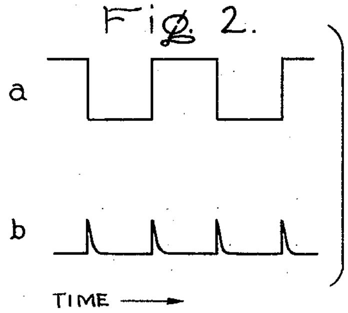

Figs. 2*a* and 2*b* are two voltage waves which may be derived from this circuit and which are both drawn on the same time axis.

Figure 3:
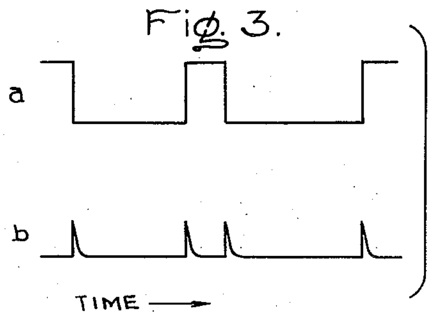

Figs. 3*a* and 3*b* are also voltage waves which may be derived from this circuit and which are drawn on the same time axis.

Figure 4:
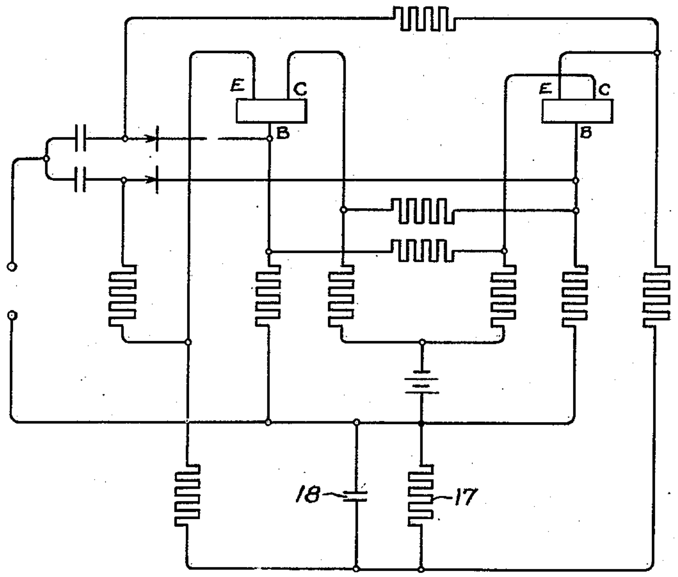

Fig. 4 is a schematic electric diagram of a preferred form of my triggered multivibrator.

It is assumed that the present theory relating to the operation of transistors is well-known and, therefore, I shall not endeavor to explain the action of a transistor. A brief discussion of the operation of these semi-conductors may, however, facilitate a better understanding of my multivibrator circuit.

In comparing a transistor to a vacuum tube, the current flowing from the base electrode to the collector electrode in a transistor may be likened to the plate-to-cathode current in a vacuum tube. The emitter electrode which is the control electrode may be likened to the control grid of a vacuum tube, and a positive voltage with respect to the base electrode voltage applied to the emitter electrode causes an amplified current in the collector electrode circuit. In actual operation, this emitter electrode voltage which is usually positive and of the order of a few tenths of a volt may control a relatively high current in the collector electrode circuit when the collector electrode voltage is negative and of a high voltage such, for example, as 20–50 volts. Consequently, if collector current exists, and if the emitter and collector voltages are held constant while the base electrode voltage is slightly increased, current in the collector circuit decreases because the emitter electrode to base electrode voltage, which is the control voltage, decreases. Thus an increase in base electrode voltage may be used to change the conduction of the transistor.

Referring to Fig. 1, there is shown a pair of three electrode transistors arranged in a symmetrical multivibrator circuit in which it should be noted there are no time delay capacitors as is usually the case in multivibrator circuits employing high vacuum electron discharge devices. In this circuit a positive trigger voltage is supplied through a pair of blocking capacitors 1 and 2 to a pair of unidirectional impedance devices 3 and 4 from which the output is supplied to the base electrodes of a pair of transistors 5 and 6. These transistors are shown in the drawing as having three electrodes, an emitter electrode labeled E, a collector electrode labeled C, and a base electrode labeled B. A resistor 7 couples the base electrode of transistor 5 to the collector electrode of transistor 6, and a resistor 8 similarly couples the base electrode of transistor 6 to the collector electrode of transistor 5. A pair of resistors 9 and 10 are serially interconnected between the collector electrodes of transistors 5 and 6; a second pair of resistors 11 and 12 are serially interconnected between the base electrodes of transistors 5 and 6, and a third pair of resistors 13 and 14 are serially interconnected between the emitter electrodes of transistors 5 and 6. A direct voltage source $V_1$ has its negative terminal directly connected to the junction of resistors 9 and 10 and its positive terminal connected to the junction of resistors 11 and 12. A second direct voltage source $V_2$ has its positive terminal connected to the positive terminal of source $V_1$ and its negative terminal connected to the junction of resistors 13 and 14. The junction of capacitor 1 and device 3 is coupled through a resistor 15 to the negative terminal of a direct voltage source $V_3$, the positive terminal of which is directly coupled to the emitter electrode of transistor 6. The junction of capacitor 2 and device 4 is connected through a resistor 16 to the negative terminal of a direct voltage source $V_4$ whose positive terminal is directly coupled to the emitter electrode of transistor 5.

Assume that transistor 6 is in a highly conducting state, whereby with the proper selection of circuit resistance values, transistor 5 is operating at low conduction. Because the collector electrode voltage of transistor 5 is highly negative with respect to the base electrode and low collector current and practically zero emitter current exists, the emitter electrode voltage of transistor 5 is either substantially zero or perhaps slightly negative. Furthermore, a proper selection of circuit resistance values causes device 3 to be more negatively biased than device 4. By a negative bias is meant that the input terminal of the device is negative with respect to the output terminal, and therefore, only positive input voltage signals greater than this bias voltage are transmitted by the device. In this condition or mode of operation, the output voltage which appears between the collector electrodes of the two transistors remains constant, and the collector electrode of transistor 6 is positive with respect to the collector electrode of transistor 5.

A positive trigger voltage whose magnitude is greater than the bias on device 4 but less than the bias on device 3 when supplied to the junction of capacitors 1 and 2 is completely blocked by device 3 but partially passed by device 4 and, consequently, decreases the voltage of the base electrode of device 6. The decreased voltage of the base electrode reduces the emitter electrode to base electrode voltage which in turn decreases the current in the collector circuit. The voltage across resistor 10, which is dependent upon the collector current of transistor 6, decreases, increasing the negative voltage on the collector of transistor 6, and this voltage increase is coupled through resistor 7 to the base electrode of transistor 5. Increasing this base electrode voltage increases the positive voltage between the emitter and base electrodes which affects a collector current increase in transistor 5. An increase in the voltage drop across resistor 9 results from the increased collector current and this increased voltage is coupled through resistor 8 to the base electrode of transistor 6 to further decrease the emitter to base electrode voltage of transistor 6. Hence, transistor 6 is driven to low conduction, and a high current exists in the collector electrode of transistor 5 which causes the collector electrode of transistor 6 to be negative with respect to the collector electrode of transistor 5. This sequence of operations occurs in a very short time such that when a suitable positive voltage trigger is applied to the circuit, transistor 6 immediately assumes low conduction and transistor 5, high conduction. Another positive trigger now causes transistor 5 to assume low conduction and transistor 6 to assume high conduction.

Referring to Fig. 2*a* there is shown the square wave voltage output of this circuit which occurs between the collector electrodes when positive trigger voltages are applied at equal intervals of time.

Fig. 3*a* is the output of the circuit when trigger voltages of the type shown in Fig. 3*b* are applied.

The voltage sources which are shown in this circuit may be eliminated or at least substituted for by perhaps a resistor shunted by a large bypass capacitor. One such possible arrangement is illustrated in Fig. 4 in which voltage source $V_2$ of Fig. 1 has been replaced by the parallel arrangement of resistor 17 and capacitor 18 and voltage sources $V_3$ and $V_4$ have been eliminated. Because transistors have an anticipated long life, this device may have considerable potential for computer use at the time when transistors can be made reproduceable.

While it is understood that the circuit specifications of the flip-flop multivibrator circuit shown in Fig. 1 may vary according to the design for any particular application, the following circuit specifications have been found satisfactory for flip-flop operation:

| | | |
|---|---|---|
| $R_{11}$, $R_{12}$ | ohms | 3000 |
| $R_7$, $R_8$ | do | 2000 |
| $R_{13}$, $R_{14}$ | do | 1000 |
| $R_9$, $R_{10}$, $R_{15}$, $R_{16}$ | do | 10,000 |
| Source $V_3$, Source $V_4$ | volts | 1.5 |
| Source $V_1$ | do | 45 |
| Source $V_2$ | do | 7.5 |
| Trigger voltage X | do | $+1.0<X<+2.4$ |

While certain specific embodiments have been shown and described, it will, of course, be understood that various modifications may be made without departing from the invention. The appended claims are, therefore, intended to cover any such modifications within the true spirit and scope of the invention.

What I claim as new and desire to secure by Letters Patent of the United States is:

1. In combination, a first and a second transistor each having an emitter electrode, a collector electrode and a base electrode, the base electrode of said first transistor being resistance coupled to the collector electrode of said second transistor, the base electrode of said second transistor being resistance coupled to the collector electrode of said first transistor, a first direct-voltage source having its negative terminal connected through a resistor to the collector electrode of said first transistor and also having its negative terminal connected through another resistor to the collector electrode of said second transistor, a resistor being interconnected between the positive terminal of said first voltage source and the base electrode of said first transistor, a resistor interconnected between the positive terminal of said first voltage source and the base electrode of said second transistor, a second direct-voltage source having its positive terminal connected to the positive terminal of said first voltage source, a resistor being interconnected between the negative terminal of said second voltage source and the emitter electrode of said first transistor, a resistor interconnected between the negative terminal of said second voltage source and the emitter electrode of said second transistor, a unidirectional impedance device being connected with its output terminal connected to the base electrode of said first transistor, a second unidirectional impedance device being connected with its output terminal connected to the base electrode of said second transistor, a direct voltage source having its positive terminal connected to the emitter electrode of said first transistor and its negative terminal resistance coupled to the input terminal of said second unidirectional impedance device, a direct voltage source having its positive terminal connected to the emitter electrode of said second transistor and having its negative terminal resistance coupled to the input terminal of said first unidirectional impedance device and a first capacitor interconnected between signal input terminal and the input terminal of said first unidirectional device and a second capacitor being interconnected between said signal input terminal and the input terminal of said second unidirectional device.

2. In combination, a first and a second transistor each having an emitter electrode, a collector electrode and a base electrode, the base electrode of said first transistor being resistance coupled to the collector electrode of said second transistor, the base electrode of said second transistor being resistance coupled to the collector electrode of said first transistor, a direct-voltage source, the negative terminal of said source being electrically connected through a resistor to the collector electrode of said first transistor, and also being connected through a resistor to the collector electrode of said second transistor, a resistor being interconnected between the positive terminal of said source and the base electrode of said first transistor, a resistor being interconnected between the positive terminal of said source and the base electrode of said second transistor, the positive terminal of said source being electrically connected to the emitter electrode of said first transistor and also being electrically connected to the emitter electrode of said second transistor, a first unidirectional impedance device having its output terminal electrically connected to the base electrode of said first transistor and having its input terminal electrically connected to the emitter electrode of said second transistor, a second unidirectional impedance device having its output terminal connected to the base electrode of said second transistor and having its input terminal electrically connected to the emitter electrode of said first transistor, a capacitor being interconnected between a signal input terminal and the input terminal of said first device, and a second capacitor being interconnected between said signal input terminal and the input terminal of said second device.

3. In combination, a first and a second transistor each having an emitter electrode, a collector electrode and a base electrode, a resistance being interconnected between the base electrode of said first transistor and the collector electrode of said second transistor, a resistor being interconnected between the collector electrode of said first transistor and the base electrode of said second transistor, a direct-voltage source having a negative and a positive terminal, a resistor being interconnected between the collector electrode of said first transistor and the negative terminal of said voltage source, a resistor being interconnected between the collector electrode of said second transistor and the negative terminal of said voltage source, a resistor being interconnected between the base electrode of said first transistor and the positive terminal of said voltage source, a resistor being interconnected between the base electrode of said second transistor and the positive terminal of said voltage source, an electrical connection being interconnected between the emitter electrode of said first transistor and the positive terminal of said voltage source, another electrical connection being interconnected between the emitter electrode of said second transistor and the positive terminal of said voltage source, a first unidirectional impedance device having its output terminal connected to the base electrode of said first transistor and having its input terminal electrically connected to the emitter electrode of said second transistor, a second unidirectional impedance device having its output terminal connected to the base electrode of said second transistor and having its input terminal electrically connected to the emitter electrode of said first transistor, an input voltage terminal, a first capacitor being interconnected between said input voltage terminal and the input terminal of said first impedance device, and a second capacitor being interconnected between said input voltage terminal and the input terminal of said second impedance device, whereby a square topped voltage wave appears between the collector electrodes of said first and second transistors which is at a frequency equal to one-half the frequency of a positive voltage which is applied between the positive terminal of said voltage source and said input voltage terminal.

RICHARD F. SHEA.

REFERENCES CITED

The following references are of record in the file of this patent:

UNITED STATES PATENTS

| Number | Name | Date |
|---|---|---|
| 2,531,076 | Moore | Nov. 21, 1950 |
| 2,533,001 | Eberhard | Dec. 5, 1950 |

OTHER REFERENCES

"Journal of Applied Physics," vol. 21, Jan. 1950, p. 49 etc.

"Transistor Trigger Circuits," Reiche and Ungvary, Review of Scientific Instruments, Aug. 1949, pp. 586–588.